US006245682B1

United States Patent
Fu et al.

(10) Patent No.: US 6,245,682 B1
(45) Date of Patent: Jun. 12, 2001

(54) REMOVAL OF SION ARC FILM AFTER POLY PHOTO AND ETCH

(75) Inventors: Chu-Yun Fu, Taipei; Syun-Ming Jang, Hsin-Chu, both of (TW)

(73) Assignee: Taiwan Semiconductor Manufacturing Company, Hsin-chu (TW)

(*) Notice: Subject to any disclaimer, the term of this patent is extended or adjusted under 35 U.S.C. 154(b) by 0 days.

(21) Appl. No.: 09/266,374

(22) Filed: Mar. 11, 1999

(51) Int. Cl.$^7$ .................. H01L 21/311; H01L 21/336; H01L 21/461

(52) U.S. Cl. .................. 438/696; 438/257; 438/756; 438/952; 216/99

(58) Field of Search .................. 438/257, 593, 438/594, 696, 756, 952, 963, 970

(56) References Cited

U.S. PATENT DOCUMENTS

| | | | |
|---|---|---|---|
| 4,657,630 | * 4/1987 | Agatsuma | 156/643 |
| 5,269,879 | 12/1993 | Rhoades et al. | 156/643 |
| 5,472,827 | * 12/1995 | Ogawa et al. | 430/315 |
| 5,600,165 | 2/1997 | Tsukamoto et al. | 257/323 |
| 5,674,356 | * 10/1997 | Nagayama | 156/659.11 |
| 5,741,396 | 4/1998 | Loewenstein | 156/643.1 |
| 5,904,564 | * 5/1999 | Park | 438/683 |
| 5,937,319 | * 8/1999 | Xiang et al. | 438/585 |
| 6,074,905 | * 6/2000 | Hu et al. | 438/224 |
| 6,083,852 | * 7/2000 | Cheung et al. | 438/791 |
| 6,103,632 | * 8/2000 | Kumar et al. | 438/717 |

OTHER PUBLICATIONS

Wu, J., et al., "Comparing Inorganic and Organic BARC for a Deep Sub–Micron Gate Patterning & Etch", Proc. SPIE vol. 3332, pp.696–709 (1998).*
Chen, I., et al., "Microelectronic Device and Multilevel Interconnection Technology II", SPIE vol. 2875, pp. 188–200 (1996).*

* cited by examiner

Primary Examiner—Randy Gulakowski
Assistant Examiner—Jiri Smetana
(74) Attorney, Agent, or Firm—George O. Saile; Stephen B. Ackerman

(57) ABSTRACT

This invention relates to the fabrication of integrated circuit devices and more particularly to a method for forming and then later removing a silicon oxynitride, SiON, anti-reflection coating (ARC) over a semiconductor substrate, for the purpose of enhancing the resolution of photolithographically defined sub-micron polysilicon gates. The problem addressed by this invention is that the SiON ARC must first be used to reduce optical reflection from a blanket polysilicon surface, during the photolithography exposure step that defines the sub-micron polysilicon gate features, and then the ARC must be removed by a wet etch process that will not chemically attack the gate oxide under the polysilicon gate features or any exposed polysilicon surfaces. This is accomplished with a fabrication method that uses hot phosphoric acid ($H_3PO_4$) to preferentially etch the $S_iON$ ARC, relative to the thermal gate oxide, while also using thin thermal oxide layers to protect the polysilicon gate surfaces from being severely attacked by the hot $H_3PO_4$. This new method also features the ability to tailor the combination of the composition and thickness of the $S_iON$ layer and the thickness of the underlying protective thin thermal oxide layer, in order to minimize the undesired high optical reflectivity of the underlying polysilicon surface.

19 Claims, 2 Drawing Sheets

REMOVAL OF SION ARC FILM AFTER POLY PHOTO AND ETCH

FIELD OF THE INVENTION

This invention relates to the fabrication of integrated circuit devices and more particularly to a method for using a wet etch process to remove an anti-reflective coating (ARC), made from silicon oxynitride ($S_iON$), after the ARC has been used to enhance the photolithograpic definition of sub-micron polysilicon gate structures. The main problem addressed by this invention is the need to avoid severe polysilicon attack from the wet etch step, when hot phosphoric acid ($H_3PO_4$) is used as the etchant.

BACKGROUND OF THE INVENTION AND PRIOR ART

As the demand to push semiconductor device features deeper into the sub-micron range has increased, numerous techniques have been developed for extending the ability of photolithograpic processes to define increasingly smaller image sizes. Since the 1970's the resolution limits of optical lithography have been reduced from about 1.5 microns down to about 0.2 microns and lower. Advancements, such as shorter exposure wavelengths, variable numerical aperture exposure lenses and phase shift masks, have contributed greatly to the progress that has occurred. In concert, anti-reflective coatings (ARC) have increasingly been incorporated into semiconductor process sequences, as a means of further enhancing critical dimension (CD) control during sub-micron photolithography steps. The use of such anti-reflective coatings can be a very effective means of minimizing photoresist exposure problems that would, otherwise, be aggravated by the high reflectivity of underlying wafer surfaces. During a photoresist exposure operation, photons that are reflected back up into the resist layer, at angles other than 90 degrees, can lead to distorted images. Scattered photons from rough underlying surfaces can lead to a general reduction in image contrast. Furthermore, scattered photons from underlying steps can lead to notched images. Even for the more ideal case of 90 degree reflection from a smooth flat underlying surface, the resultant standing wave pattern in the resist layer can also lead to a reduction in image contrast. These image control problems can occur when photoresist layers are exposed over reflective surfaces such as aluminum and polysilicon, for example. These problems can be greatly minimized by first depositing an anti-reflective coating, (ARC) prior to the application of the photoresist layer. The ARC may be in the form of a highly absorbing layer, such as a polymer, or a thin layer of titanium (Ti) or silicon oxynitride (SiON), for example. Ideally, to help minimize reflectivity, the optical properties of ARCs should be optically optimized with any underlying layers, the overlying photoresist layer and the wavelength of the exposure source. Consequently, $S_iON$ layers, by virtue of having process controllable optical properties, have become particularly attractive as ARCs.

When $S_iON$ is deposited by CVD, for example, its optical properties can be adjusted by changing the atomic composition of the film.

There are numerous methodologies used for employing ARCs. ARCs have been used in the form of localized as well as blanket layers which may or may not be deliberately removed during subsequent processing. In the case of the present invention, a method is taught for the removal of a blanket SiON layer after it has been used as an ARC for improving the image control of sub-micron polysilicon gates. Although quite advantageous from the standpoint of having adjustable optical properties, SiON as an ARC, however, is not totally devoid of its own problems, as addressed in the following patent by Tsukamoto, et. al.

U.S. Pat. No. 5,600,165 to Tsukamoto, et. al., teaches a method for using SiON as an ARC while also avoiding a device degradation problem associated With the hydrogen that is contained within the SiON film. When SiON is used as an ARC to improve the image definition of a sub-micron polysilicon gate, for example, and then allowed to remain during subsequent hot processing, hydrogen in the SiON film can diffuse down through the underlying polysilicon and gate oxide. Once the hydrogen reaches the gate oxide, its resistance to hot carrier damage can be reduced and this can, in turn, lead to unacceptable device threshold voltage instability. The patent of Tsukamoto et.al., teaches several methods to solve this potential hydrogen related problem, by means of creating hydrogen diffusion barriers (such as thin layers of silicon nitride of titanium silicide) between the SiON ARC and the gate oxide region of active devices. However, since the inventors deliberately left the SiON layer on after it was used as an ARC, no method was taught for how to remove it.

There have been prior publications that do discuss methods for the removal of SiON layers. U.S. Pat. No. 5,741,396, to Loewenstein, teaches dry isotropic etching methods for the removal of nitride, oxynitride and polysilicon layers, while not removing thin pad oxide layers that are used to protect underlying silicon regions from being attacked at the same time. The invention also discusses the use of hot phosphoric acid ($H_3PO_4$), as a wet etching means of removing nitride and oxynitride films, in conjunction with thin pad oxides to protect underlying silicon regions. However, a method for the formation and wet etch removal of a $S_iON$ film and thin pad oxide combination that have been optimized as an ARC for the photolithographic definition of polysilicon gates is not addressed.

U.S. Pat. No. 5,269,879, to Rhoades, et. al., also teaches methodologies for the dry etching of insulating films, such as silicon dioxide, silicon nitride and silicon oxynitride. This invention addresses the formation of via holes down to the underlying conductive regions of devices, while avoiding the problem of damaging the conductive regions, such as aluminum or titanium silicide, for example. The etching means includes a fluoride-containing gas, along with a passivating gas (such as nitrogen), which is used to suppress sputtering damage of the underlying conductive regions. However, similar to the above prior art, a method for the formation and wet etch removal of a SiON film and thin pad oxide combination that have been optimized as an ARC, for the photolithographic definition of polysilicon gates, is not addressed.

SUMMARY OF THE INVENTION

A principle object of the present invention is to provide an effective and manufacturable method to photolithographically define sub-micron polysilicon gate features, over a semiconductor substrate.

Another object of the present invention is to provide an improved method for using anti-reflective coatings (ARCs), as an improved means of avoiding the problem of distorted photoresist images due to spurious reflections from the underlying semiconductor substrate, during the photolithographic definition of sub-micron polysilicon gates.

A further object of the invention is to provide a method for: (1) Using silicon oxynitride (SiON) layers as ARCs on blanket polysilicon layers, to be formed into sub-micron gate features, and (2) Subsequently, removing the remaining SiON without imparting any associated etching damage to the surface of the newly formed polysilicon gate features.

A still further and primary object of the present invention is to provide a method for using hot $H_3PO_4$ acid as the means of removing the $S_iON$ based, ARC, while preventing the serious etching damage that can occur when polysilicon is exposed to hot $H_3PO_4$.

These objects are achieved by a fabrication method which uses thin oxide layers to the protect the top surface and side wall regions of the polysilicon gates from being severely attacked by hot $H_3PO_4$, comprising the steps of: (a) forming a thin protective layer of thermal silicon oxide over a blanket polysilicon layer for the purpose of protecting the polysilicon surface from direct exposure to the hot $H_3PO_4$, which will be used during an eventual $S_iON$, ARC removal step; (b) forming a thin SION ARC over the thin protective thermal oxide layer; (c) using a photolithography and dry etching process to form sub-micron polysilicon gate features; (d) forming a second thin thermal oxide layer on the exposed side walls of the newly formed polysilicon gate features for the purpose of protecting the polysilicon side walls from eventual direct exposure to hot $H_3PO_4$ etching step; (e) removal of the $S_iON$ ARC on the top surface of the polysilicon gates, by means of a hot $H_3PO_4$ wet etch process; and (f) removal of the thin protective oxide layers on the top surface and side wall areas of the polysilicon gates, by means of a dilute hydrofluoric acid wet etch process, followed by completion of sub-micron field effect devices.

The present invention solves the above problems by, primarily, using thin oxide layers to protect the top and side wall surfaces of polysilicon gates, before a hot $H_3PO_3$ etching process is used to subsequently remove a SiON ARC. This is accomplished by a new method to fabricate polysilicon gate structures. This new method features: (1) A thin protective thermal oxide layer between the SiON ARC and the polysilicon surface, (2) A subsequent second thin protective oxide layer that is grown on the side walls of newly formed polysilicon gates and (3) The ability to tailor the combination of the composition and thickness of the SiON layer and the thickness of the underlying protective thin thermal oxide layer, in order to minimize the undesired high optical reflectivity of the underlying polysilicon surface.

BRIEF DESCRIPTION OF THE DRAWINGS

In the accompanying drawings for a material part of this description, there is shown.

DESCRIPTION OF THE PREFERRED EMBODIMENTS

This invention provides a method for solving the problem of using hot $H_3PO_4$ to remove $S_iON$ ARCs after they have been used to improve the critical dimension (CD) control of sub-micron polysilicon gates. Hot $H_3PO_4$ etching is a very effective means for the removal of $S_iON$ on the surface of newly formed polysilicon gates. The undesired etching of any exposed thermal gate oxide ($S_iO_2$) around the side walls of the gates, will be at least ~100x slower than that of $S_iON$. However, hot $H_3PO_4$ can severely attack any exposed polysilicon surfaces, such as the top surface and side wall areas.

Consequently, if an ARC of $S_iON$ has been directly deposited on a blanket polysilicon surface, prior to defining polysilicon gate features, both the top surface and the side walls of the eventual polysilicon gate features will be exposed to severe attack by the subsequent hot $H_3PO_4$ etching process that is used for the removal of the remaining SiON layer. In some cases, one may be able to avoid this problem by simply allowing the SiON layer to permanently remain on the polysilicon surface. However, leaving the SiON layer in place is not always a viable solution. For example, this would not allow for the subsequent silicidation of the polysilicon gates, in order to meet device performance (switching speed) requirements. In addition, SiON layers can be rich in hydrogen that can subsequently diffuse down into gate oxide regions and, thereby, result in reduced resistance to hot carrier induced device degradation. Therefore, a solution is still needed for how to use hot $H_3PO_4$ to remove $S_iON$ layers from the surface of newly formed sub-micron polysilicon gate features, after the SiON layers have served their temporary purpose as ARCs.

Figure 1:
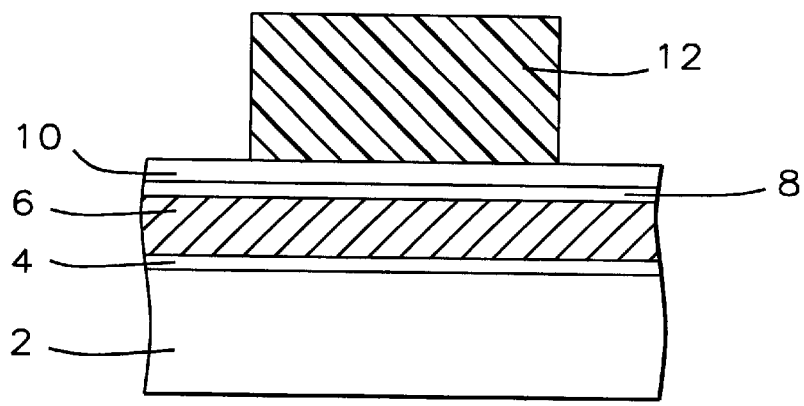
FIGS. 1 to 5 schematically illustrate in cross-sectional representation the preferred embodiments of the process of the present invention.

It is noted that the following preferred embodiments and associated figures will be presented in a way that can be generically applied to the fabrication of a variety of N channel and/or the P channel device technologies that could employ sub-micron polysilicon gates. Referring now more particularly to FIG. 1, there is shown a portion of a partially completed integrated circuit. There is shown a semiconductor substrate 2 intended to represent a conventional ion implanted N well or P well region, in which an eventual CMOS narrow channel FET will be formed. Also shown is an overlying stack consisting of a gate oxide layer 4, an overlying polysilicon layer 6. a further overlying thermal SiO2 layer 8, a still further overlying SiON ARC layer 10 and, finally, a photoresist island 12 that will be used to define a sub-micron polysilicon gate feature. It is noted that the image control of said photoresist island 12, has been enhanced by using said underlying ARC layer 10, in order to reduce the intensity of photons, reflected from said polysilicon layer 6, that would have, otherwise, tended to distort the desired sub-micron geometry of said resist layer 12. Such distortions would tend to be increasingly worse for desired gate dimensions of 0.25 microns or less.

Said gate oxide 4 is a thin thermal oxide, with a typical thickness range of about 20 to 60 Angstroms. A preferred gate oxide thickness of about 32 angstroms is grown in a steam ambient at temperature of about 700 to 1000 degrees Centigrade for a duration of about 10 to 40 mins.

Still referring to FIG. 1, said polysilicon layer 6 is preferably deposited, by means of Low Pressure Chemical Vapor Deposition, LPCVD, to a typical thickness range of about 1500 to 2500 Angstroms, with a preferred thickness of about 2000 Angstroms.

Continuing to refer to FIG. 1, said overlying SiON ARC layer 10 is typically grown to a thickness of about 250 to 350 Angstroms, with a preferred thickness of about 300 Angstroms. Said SiON ARC layer 10 is typically formed by means of a PECVD process. Such SiON ARC films have been characterized, for a deep ultraviolet, DUV, wavelength of about 320 A, and found to exhibit a complex refractive index having a real part, n, equal to about 2.12 and an imaginary part, k, equal to about 0.65.

Figure 2:
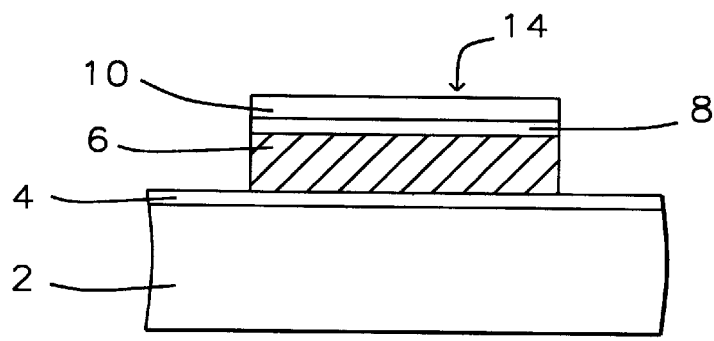

Continuing to refer to FIG. 1, photoresist island 12 is formed from a conventional DUV process, consisting of organic polymeric materials and resulting in typical photoresist layer thickness values of about 4000 to 6000 Angstroms. Referring now more particularly to FIG. 2, conventional plasma etching, such as $Cl_2$/HBr. based chemistry, is now performed on the stack, consisting of said $S_iON$ ARC layer 10, said underlying thermal oxide layer 8 and said further underlying polysilicon layer 6, in order to define polysilicon gate feature 14. Following said plasma etching, for defining polysilicon gate feature 14, photoresist island 12 is removed by a conventional photoresist stripping means, such as $H_2SO_4+H_2O_2$. As also shown in FIG. 2, the still further underlying gate oxide layer 4, acts as an etch stop for said plasma etching process.

Figure 3:
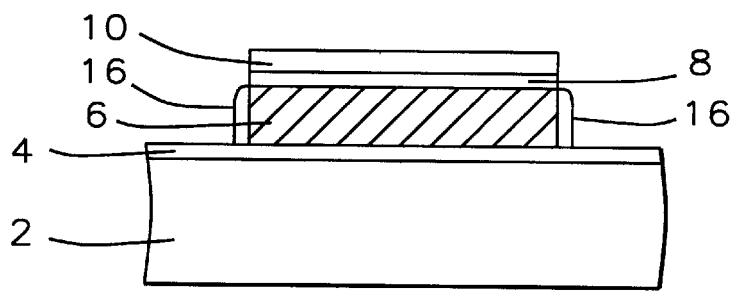

Referring now more particularly to FIG. 3, a second thin protective thermal oxide 16, is now formed on the side walls of newly formed polysilicon gate feature 14. Said oxide layer 16, in concert with said first protective oxide layer 8, will be used to protect the, otherwise, exposed top and side wall surfaces of said polysilicon gate feature 14 from being attacked during a subsequent hot $H_3PO_3$ etching step for the removal of said $S_iON$ ARC layer 10. These two aforementioned thin protective oxide layers (8 and 16), are the key to this invention. Said second protective oxide layer 16, is thermally grown to a thickness of about 20 to 50 angstroms, with a preferred thickness of about 30 Angstroms.

Figure 4:
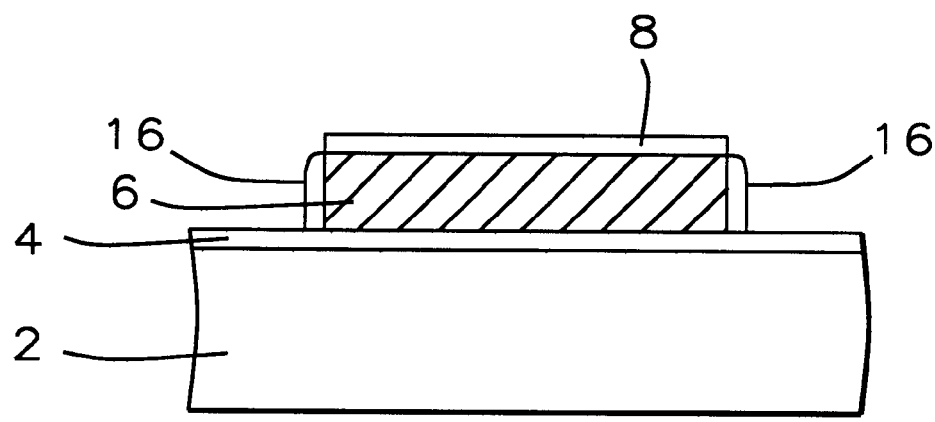

Referring now more particularly to FIG. 4, said $S_iON$ ARC layer 10 is now removed by means of a hot $H_3PO_3$ etching process. For the hot $H_3PO_3$ process, the solution is maintained at a bath temperature of about 100 to 150 degrees, Fahrenheit, and an etching time of about 600 seconds is used to remove a typical $S_iON$ ARC layer thickness of about 320 Angstroms. These conditions yield typical etch rates, for SiON, of about 50 angstroms/min, in contrast to $SiO_2$ etch rates of ~0 angstroms/min.

During the above hot $H_3PO_4$ etching process to remove said $S_iON$ ARC layer 10, the top and side wall surfaces of polysilicon gate feature 14, were protected by said first and second protective oxide layers, 8 and 16. Without this protection, there would have been chemical attack of the, otherwise exposed, polysilicon surfaces by the hot $H_3PO_3$ solution. The main objective of this invention has now been accomplished. Namely, the $S_iON$ ARC layer has been removed by a hot $H_3PO_4$ process, while also avoiding chemical attack of polysilicon gate features.

Figure 5:
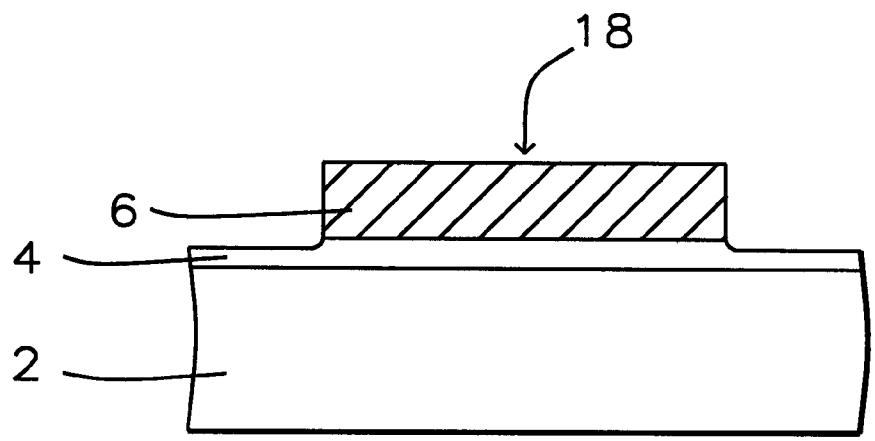

Referring now more particularly to FIG. 5, conventional dilute hydrofluoric acid (50:1) etching is now used to remove said first protective oxide layer 8 and said second protective oxide layer 16, in preparation for silicidation of the resultant polysilicon gate 6 feature 18 and other subsequent conventional process steps that may be needed for the completion of a given sub-micron FET device. For the removal of said oxide layers 8 and 16, the typical etching time is about one minute. This relatively short etching time results in minimal removal of the gate oxide 4 under the polysilicon gate 6, as shown in FIG. 5. In contrast, if a hydrofluoric acid solution would have been used in place of hot $H_3PO_4$, in order to remove the SiON ARC layer 10, the longer required etching time (about 1.2× longer) would have resulted in unacceptable removal of the gate oxide 4 under the polysilicon gate. That is why this invention exploited the faster etch rate of hot $H_3PO_4$, for $S_iON$ removal, while also solving the problem of the hot $H_3PO_4$ solution being able to attack any exposed polysilicon surfaces.

The objects of the invention have now been accomplished. A critical dimension (CD) control problem has been solved by using a $S_iON$ ARC as a means of minimizing spurious reflected photons from leading to distorted photoresist images, during the photolithographic exposure step used for defining sub-micron polysilicon gates.

The key to this invention is a solution to the consequent problem, that was created, after having choosen hot $H_3PO_4$ as the etchant for the removal of $S_iON$, with regard to how to subsequently remove the SiON ARC in a manner that would not result in unacceptable attack of the gate oxide or of the polysilicon gate surfaces. As discussed, above, this was accomplished by using hot $H_3PO_4$ (instead of a hydrofluoric acid solution), to selectively etch the ARC relatively faster than the gate oxide, while also using thin thermal oxide layers to the protect polysilicon surfaces from being attacked at the same time.

While the invention has been particularly shown and described with reference to the preferred embodiments thereof, it will be understood by those skilled in the art that various changes in form and details may be made without departing from the spirit and scope of the invention.

What is claimed is:

1. A method for removing SiON layers from polysilicon gate features, while also protecting said polysilicon features and underlying gate oxides from being appreciably attacked or etched at the same time, comprising the steps of:
   (a) forming a first insulating oxide layer over a polysilicon layer, over a semiconductor substrate, to be used as an eventual selective etch stopping layer;
   (b) forming a SiON layer over said first insulating layer
   (c) forming sub-micron polysilicon gate features by etching said SiON, insulating oxide and polysilicon layers;
   (d) forming a second insulating oxide layer on the side walls of said polysilicon features; and
   (e) selectively wet etching said SiON layer, by means of $H_3PO_4$ which etches SiON relatively faster than silicon oxide, whereby said first and second insulating oxide layers will protect said polysilicon layer from chemical attack and said underlying gate oxide layer will also remain in tact.

2. The method of claim 1 wherein the thickness of said first insulating oxide layer is between about 20 to 50 Angstroms.

3. The method of claim 1 wherein the thickness of said SiON layer is between about 250 and 350 Angstroms.

4. The method of claim 1 wherein the thickness of said second insulating oxide layer is between about 20 and 50 Angstroms.

5. The method of claim 1 wherein the thickness of said gate oxide layer is between about 20 to 60 Angstroms.

6. The method of claim 1 wherein the thickness of said polysilicon layer is between about 1500 to 2500 Angstroms.

7. The method of claim 1 wherein said hot $H_3PO_4$ etching step exhibits an etch rate of about 50 angstroms/min. for SiON, along with a much slower etch rate of about 0 Angstroms/min. for the case of thermal silicon oxide.

8. A fabrication method for selectively removing SiON layers from polysilicon gate features, after said layers have been used as anti-reflective coatings (ARCs), for the purpose of enhancing the photolithographic definition of sub-micron polysilicon gate features, comprising the steps of:
   (a) forming blanket gate oxide layer and an overlying blanket polysilicon layer over a semiconductor substate;
   (b) forming a first insulating oxide layer over said polysilicon layer;
   (c) forming a SiON based layer over said first insulating layer;
   (d) patterning the stack, consisting of said polysilicon layer, said thermal oxide layer and said ARC layer, into sub-micron polysilicon gate features;

(e) forming a second protective insulating oxide layer on the side walls of said polysilicon features; and (f) selectively wet etching said SiON based layer from the top surface of said polysilicon gate features, by means of hot $H_3PO_4$ whereby said first and second protective insulating oxide layers are not appreciably etched.

9. The method of claim 8 where removal of said first and second protective insulating oxide layers from the top and side wall surfaces of said polysilicon features, by means of a rapid hydrofluoric acid etching step that will not appreciably remove said underlying gate oxide layer.

10. The method of claim 8 wherein the thickness of said first insulating oxide layer is between about 20 to 50 Angstroms.

11. The method of claim 8 wherein the thickness of said SiON layer is between about 250 and 350 Angstroms.

12. The method of claim 8 wherein the thickness of said second insulating oxide layer is between about 20 and 50 Angstroms.

13. The method of claim 8 wherein the thickness of said gate oxide layer is between about 20 to 60 Angstroms.

14. The method of claim 8 wherein the thickness of said polysilicon layer is between about 1500 to 2500 Angstroms.

15. The method of claim 8 wherein said hot $H_3PO_4$ etching step exhibits an etch rate of about 50 Angstroms/min. for SiON and a much slower etch rate of about 0 angstroms/min. for the case of thermal silicon oxide.

16. The method of claim 8 wherein the thickness values and the optical constants of said first insulating layer and said SiON ARC layer are approximately optimized for minimal optical reflectivity from the surface of said underlying polysilicon surface.

17. The method of claim 16 wherein said first insulating layer is a thermal oxide with a thickness range of about 20 to 50 angstroms and where the thickness of said SiON layer is between about 250 to 350 Angstroms, for case of the optical constants for said SiON layer being about 2.12 for n and about 0.65 for the value of k.

18. The method of claim 8 wherein said hydrofluoric acid, HF, solution is a 50:1 mixture of water and HF and having an approximate etch rate of about 55 Angstroms/min. for thermal oxide and an approximate etch rate of about 40 Angstroms/min. for said SiON layer.

19. The method of claim 8 wherein said SiON ARC layer is formed by means of a PECVD deposition process.

* * * * *